(12) United States Patent
Aiba

(10) Patent No.: US 6,677,595 B1
(45) Date of Patent: Jan. 13, 2004

(54) SPECIMEN HOLDER AND SPACER USED IN THE SAME

(75) Inventor: Toshiaki Aiba, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/557,959

(22) Filed: Apr. 25, 2000

(30) Foreign Application Priority Data

Apr. 28, 1999 (JP) ............................................ 11-122573
Apr. 28, 1999 (JP) ............................................ 11-122702
Apr. 11, 2000 (JP) ...................................... 2000-109383

(51) Int. Cl.[7] ............................................... H01J 37/20
(52) U.S. Cl. ............................ 250/442.11; 250/440.11; 250/441.11; 250/443.11; 250/311
(58) Field of Search ...................... 250/440.11, 441.11, 250/442.11, 305, 306, 311, 443.11, 309, 310

(56) References Cited

U.S. PATENT DOCUMENTS

| 5,001,350 A | * | 3/1991 | Ohi et al. ................. 250/440.1 |
| 5,114,234 A | * | 5/1992 | Otsuka et al. .............. 356/358 |
| 5,367,171 A | * | 11/1994 | Aoyama et al. ......... 250/443.1 |
| 5,581,088 A | * | 12/1996 | Kasai .................... 250/440.11 |
| 5,591,980 A | * | 1/1997 | Ogasawara et al. .... 250/442.11 |
| 5,852,298 A | * | 12/1998 | Hatakeyama et al. .... 250/492.2 |
| 6,002,136 A | * | 12/1999 | Naeem .................. 250/442.11 |
| 6,410,925 B1 | * | 6/2002 | Armbruster et al. ... 250/442.11 |

FOREIGN PATENT DOCUMENTS

JP 11-185686 7/1999

* cited by examiner

Primary Examiner—John R. Lee
Assistant Examiner—David A. Vanore
(74) Attorney, Agent, or Firm—Fitzpatrick, Cella, Harper & Scinto

(57) ABSTRACT

A specimen holder including a specimen-holding table including a plane for placing a specimen, and a pair of members protruding from the plane, with the specimen-holding table being disposed between the pair of members. Here, the plane of the specimen-holding table is formed at an angle from a plane including top portions of the pair of members protruding from the plane of the specimen-holding table. The invention provides an electron microscope holder and a spacer used therein, which provide a high X-ray detection efficiency even when EDX analysis using an X-ray analyzer whose center axis only makes a small angle with a specimen-holding surface is performed on a specimen to be sectionally observed by TEM produced by FIB processing.

18 Claims, 9 Drawing Sheets

SPECIMEN HOLDER AND SPACER USED IN THE SAME

BACKGROUND OF THE INVENTION

1. Field of the Invention

The present invention relates to a specimen holder, and more specifically to an electron microscope specimen holder and a spacer used in the same. Even more specifically, the present invention relates to an electron microscope specimen holder useful in performing EDX (energy dispersive X-ray spectroscopy) analysis of a specimen produced by a focused ion beam (FIB) method, and a spacer used in the same.

2. Description of the Related Art

Transmission electron microscopes (TEM) are widely used not only in basic materials research, but also in the development of materials and devices as an indispensable analyzing means. In particular, in recent years, developments have been made in, for example, semiconductor-device film formation technology and micromachining. This has resulted in a demand for not only observations with higher resolution, but also analysis of very small areas. As a means for responding to these demands, transmission electron microscopes are becoming increasingly important. One method which is widely used in analyzing very small areas is the energy dispersive X-ray spectroscopy method.

In recent years, focused ion beam (FIB) processing devices have been developed, and are starting to be applied in various fields. They are typically used in the semiconductor-manufacturing field. A technology for producing a specimen of a specific portion of, for example, a semiconductor device to be sectionally observed using TEM is attracting attention as one technology to which focused ion beam processing devices can be applied. This technology is, in particular, used to produce a specimen (or to form thinner pieces) for TEM observation.

A description of a conventional side-entry-type specimen holder for an electron microscope will be given with reference to FIGS. 7 to 11 and FIG. 15. FIG. 15 is a schematic view of a conventional electron microscope device. In FIGS. 7 to 14, a longitudinal direction (or an X-axis direction) of a holder body 1 on which a specimen 21 is placed is substantially perpendicular to a direction (or a Z-axis direction) in which electrons are emitted from an electron-emitting means. FIG. 7 is a plan view schematically illustrating the specimen holder. FIG. 8 is an enlarged schematic view of portion A of FIG. 7, as viewed from the Z-axis direction. FIG. 9 is a sectional view along the X-axis direction (or the X-Z plane) of FIG. 8. FIG. 10 is a sectional view along the Y-axis direction (or the Y-Z plane) of FIG. 8. FIG. 11 is a sectional view showing a state in which the holder is tilted from its state in FIG. 10, with the X-axis as a center. In FIGS. 7 to 15, the X-axis directions, the Y-axis directions, and the Z-axis directions are consistently represented throughout.

The specimen holder shown in FIGS. 7 to 11 primarily comprises the holder body 1, a specimen-holding table 2 for holding the specimen 21, and a specimen holding-down means 3. The specimen 21 is held by being sandwiched between the specimen-holding table 2 and the specimen holding-down means 3. In this specimen holder, the specimen holding-down means 3 is secured to the specimen-holding table 2 with a screw 9 in order to hold the specimen 21. The holder body 1 includes protrusions which protrude beyond a specimen-holding surface 11 and a plane where a meshed section 23 is disposed (or beyond a plane where the specimen 21 is disposed). The protrusions are formed so as to protrude above the specimen-holding surface 11, the plane of the specimen-holding table 2, and the specimen 21 itself in the Z-axis direction in order to provide mechanical strength to the specimen holder itself. Here, the specimen-holding surface 11 of the specimen-holding table 2 and a specimen-holding surface 12 of the specimen holding-down means 3 are formed substantially parallel to a horizontal surface of the holder body 1. Here, the specimen-holding table 2 and the specimen holding-down means 3 do not comprise parts. Depending on the specimen-holding method, the specimen-holding table 2 and the specimen holding-down means 3 may comprise a plurality of component parts. The specimen holder is not provided with any other special functions. However, depending on the goniometer (not shown) installed in the electron microscope, the specimen 21 and the specimen holder body 1 are tilted (or rotated) with respect to the X-axis in FIG. 8 as a center, as shown in FIG. 11. Hereunder, the tilting direction shown in FIG. 11 is called a + direction, with the horizontal posture of the holder body 1 (shown in FIG. 10) serving as a reference.

Although not specifically illustrated, as disclosed in, for example, Japanese Patent Laid-open No. 11-185686, there are various types of specimen holders for electron microscopes. They include a biaxially tilting specimen holder, a specimen cooling holder, a specimen heating holder, a specimen pulling holder, and a combination thereof. The biaxially tilting specimen holder has a mechanism for tilting specimen-holding table 2, with a direction perpendicular to the longitudinal direction of the holder body 1 (or perpendicular to the X-axis direction in FIG. 8), that is, the Y-axis direction in FIG. 8, serving as a center axis for tilting. The specimen cooling holder has a mechanism for cooling specimen 21. The specimen heating holder has a mechanism for heating specimen 21. The specimen pulling holder has a mechanism for pulling specimen 21.

With reference to FIGS. 7 to 11, an example of the energy dispersive X-ray spectroscopy (EDX) analysis carried out using the conventional electron-microscope specimen holder will be described. In the EDX analysis, as shown in FIG. 15, when the specimen 21 held by the specimen holder is irradiated with electron beams, X-rays produced from the specimen 21 are detected by an X-ray analyzer 31 in order to obtain an energy spectrum. As shown in FIG. 10, when the angle of the center axis of the X-ray analyzer 31 from the specimen-holding surface 11 is small, the sensitivity with which X-rays are detected can be made large by decreasing the distance between the specimen 21 and the X-ray analyzer 31. Therefore, the X-ray analyzer 31 in which the angle of the center axis is small is becoming the dominating type of X-ray analyzer. In order to simplify the configuration, the X-ray analyzer 31 is mainly disposed in a direction perpendicular to the longitudinal direction (or in a direction perpendicular to the X-axis direction) of the specimen holder, that is, in the Y-axis direction of the specimen holder, as shown in FIG. 8.

SUMMARY OF THE INVENTION

Accordingly, it is an object of the present invention to provide an electron microscope holder having a high X-ray detection efficiency even in EDX analysis carried out on a specimen to be subjected to sectional TEM observation with an X-ray analyzer.

To this end, according to one aspect of the present invention, there is provided a specimen holder (a specimen-supporting member) comprising a specimen-holding table including a specimen-placing plane (or a specimen-holding surface); and a pair of protruding members (or protruding portions) protruding beyond the specimen-placing plane (or the specimen-holding surface) and having the specimen-holding table disposed therebetween. The specimen-holding surface (or the top surface) of the specimen-holding table (or the surface of the specimen-holding table where the specimen is placed) is formed at an angle from (that is, not parallel to) a plane including the top portions (or the top surfaces or the topmost portions) of the pair of protruding members (or protruding portions) protruding beyond the specimen-placing plane.

In the specimen holder of the present invention, the specimen-holding surface of the specimen-holding table (or the top surface of the specimen-holding table corresponding to the specimen-placing surface, or the meshed-section-placing surface, of the specimen-holding table may be formed at an angle of less than 45 degrees from the plane including the top portions (or the top surfaces or the topmost portions) of the pair of protruding members (or protruding portions) protruding beyond the specimen-placing plane. It is preferably formed at an angle of from 1 to 25 degrees inclusive.

According to another aspect of the present invention, there is provided a specimen holder (specimen-supporting means) comprising a specimen-holding table including a specimen-placing plane (or a specimen-holding surface); and a pair of protruding members (or protruding portions) protruding beyond the specimen-placing plane and having the specimen-holding table disposed therebetween. The specimen-holding surface (or the top surface) of the specimen-holding table (or the surface of the specimen-holding table where the specimen is placed) is formed at an angle from (that is, not parallel to) a line connecting top portions (or top surfaces or topmost portions) of the pair of protruding members (or protruding portions) protruding beyond the specimen-placing plane.

In the specimen holder of the present invention, the specimen-holding surface of the specimen-holding table (or the top surface of the specimen-holding table corresponding to the specimen-placing surface of the specimen-holding table) may be formed at an angle of less than 45 degrees from the line connecting the top portions of the pair of members protruding beyond the plane where a specimen is placed. It is preferably formed at an angle of from 1 to 25 degrees inclusive.

According to still another aspect of the present invention, there is provided a specimen holder for an electron microscope, comprising: a holder body, a specimen-holding table provided at the holder body and including a specimen-holding surface for placing a specimen thereon; and a specimen holding-down means for holding down the specimen on the specimen-holding table; wherein, when the holder body is in a horizontal posture, the specimen-holding surface of the specimen-holding table is tilted, with a longitudinal direction of the holder body defining a center axis of tilting.

The specimen holder for an electron microscope may further comprise an X-ray analyzer disposed so as to face a direction perpendicular to the longitudinal direction of the holder body, wherein the specimen-holding surface of the specimen-holding table may be tilted so that a side of the specimen-holding surface of the specimen-holding table closer to the X-ray analyzer becomes nearest to the X-ray analyzer.

The specimen holding-down means may include a specimen-holding surface which is correspondingly tilted with the tilted specimen-holding surface of the specimen-holding table.

The specimen holder may further comprise a mechanism for tilting the specimen-holding table, with a direction perpendicular to the longitudinal direction of the holder body defining a center axis of tilting.

The specimen-holding table may integrally be formed with the holder body.

The specimen-holding table may comprise a specimen-holding-table base section formed integrally with the holder body, and a specimen-holding-table spacer having the specimen-holding surface and being removable from the specimen-holding-table base section.

The specimen holding-down means may comprise a specimen-holding-down-means base section and a specimen-holding-down-means spacer having a specimen-holding surface and being removable from the specimen-holding-down-means base section.

According to still another aspect of the present invention, there is provided a specimen-holder spacer for an electron microscope used in a specimen holder comprising a holder body, a specimen-holding table provided at the holder body and used to place a specimen thereon, and a specimen holding-down means for holding down the specimen on the specimen-holding table;

wherein the spacer includes a specimen-holding surface for placing the specimen thereon, and is removable from the specimen-holding table; and wherein when the holder body is in a horizontal posture, the specimen-holding surface of the spacer mounted to the specimen-holding table is tilted, with a vicinity of a longitudinal direction of the holder body defining a center axis of tilting.

In the specimen-holding spacer embodiment, as in the embodiments without spacers, in the spacer, an X-ray analyzer may be disposed so as to face a direction perpendicular to the longitudinal direction of the holder body. In addition, the specimen-holding surface of the spacer may be tilted so that a side of the specimen-holding surface of the spacer mounted to the specimen-holding table nearest to the X-ray analyzer becomes closer to the X-ray analyzer.

The specimen holding-down means may include a specimen-holding surface correspondingly tilted with the specimen-holding surface of the spacer mounted to the specimen-holding table.

According to still another aspect of the present invention, there is provided a specimen-holder spacer used in an electron microscope specimen holder comprising a holder body, a specimen-holding table provided at the holder body and used to place a specimen thereon, and a specimen holding-down means for holding down the specimen on the specimen-holding table;

wherein when the specimen holding-down means having the spacer mounted thereto is further mounted to the specimen-holding table and when the holder body is in a horizontal posture, the specimen-holding surface of the spacer is tilted, with a longitudinal direction of the holder body defining a center axis of tilting.

In the specimen holder, an X-ray analyzer may be disposed so as to face a direction perpendicular to the longitudinal direction of the holder body. In addition, the specimen-holding surface of the spacer may be tilted so that a side of the specimen-holding surface of the spacer mounted to the specimen-holding table and the specimen holding-down means closer to the X-ray analyzer becomes nearest to the X-ray analyzer.

The specimen-holding table may include a specimen-holding surface which is correspondingly tilted with the specimen-holding surface of the spacer mounted to the specimen holding-down means.

According to still another aspect of the present invention, there may be provided a specimen holder (specimen-supporting means) for an electron microscope comprising:
- a holder body;
- a specimen-holding table provided at the holder body, the specimen-holding table having a specimen-holding surface for placing a specimen thereon; and
- a specimen holding-down means for holding down the specimen on the specimen-holding table;
- wherein the specimen-holding table is provided at the holder body through a tilting mechanism; and
- wherein the tilting mechanism tilts (rotates) the specimen-holding table, with a longitudinal direction of the holder body defining a center axis of tilting (rotating).

The specimen holder may further comprise an X-ray analyzer disposed so as to face the direction perpendicular to the longitudinal direction of the holder body.

The specimen holder may further comprise a mechanism for tilting the specimen-holding table, with a direction perpendicular to the longitudinal direction of the holder body defining the center axis of tilting.

In each specimen-holding member (specimen-supporting means) having the above-described corresponding structure in accordance with the present invention, each specimen-holding surface is tilted (rotated), with the longitudinal direction (or the X-axis direction) of its corresponding holder body defining the tilting (rotating) axis. In addition, each specimen-holding surface is tilted so that the side of each specimen-holding surface nearest to its corresponding X-ray analyzer becomes closer thereto. Accordingly, even when the optimal tilting angle for observing the specimen itself is small, the tilting angle of each specimen holder itself can be made large. Consequently, it is possible to mitigate the problem of X-rays produced from the specimen being subjected to EDX analysis being intercepted by an edge (a protrusion) of a specimen holder. Because of this, it is possible to mitigate the problems of X-ray detection efficiency being reduced or of X-rays not being detected. These operational features are particularly beneficial when carrying out EDX analysis of specimen, such as a specimen to be subjected to sectional TEM observation produced by the FIB method, whose optimal tilting angle is small, with the X-axis direction of the specimen itself defining the tilting axis during TEM observation.

Each specimen holder having the above-described structure in accordance with the present invention may comprise a mechanism for tilting (rotating) the specimen-holding table, with the longitudinal direction (or the X-axis direction) of the holder body defining the center axis of tilting (rotating). Therefore, the tilting (rotating) angle when the X-axis direction of the specimen-holding surface or the specimen itself defines the tilting axis can be made to differ from the tilting angle when the X-axis direction of the specimen holder itself defines the tilting axis (the tilting angle being formed using a tilting mechanism, such as a goniometer of an electron microscope). In other words, by tilting the specimen-supporting table in one direction using the tilting mechanism of the specimen holder, and, at the same time, by tilting the specimen holder itself in the opposite direction using, for example, a goniometer, the tilting angle of the specimen holder can be made large even when the optimal tilting angle for observing the specimen itself is small. With this arrangement, it is possible to mitigate the problem of the X-rays produced from the specimen during EDX analysis being intercepted by an edge of the specimen holder. Therefore, it is possible to mitigate the problems of the detection efficiency of the X-rays produced from the specimen being reduced and not being detected. This operational feature is particularly beneficial when carrying out EDX analysis of a specimen, such as a specimen to be subjected to TEM observation produced by the FIB method, whose optimal tilting angle is small, with the X-axis direction of the specimen itself defining the tilting axis during TEM observation.

DESCRIPTION OF THE PREFERRED EMBODIMENTS

Figure 8:
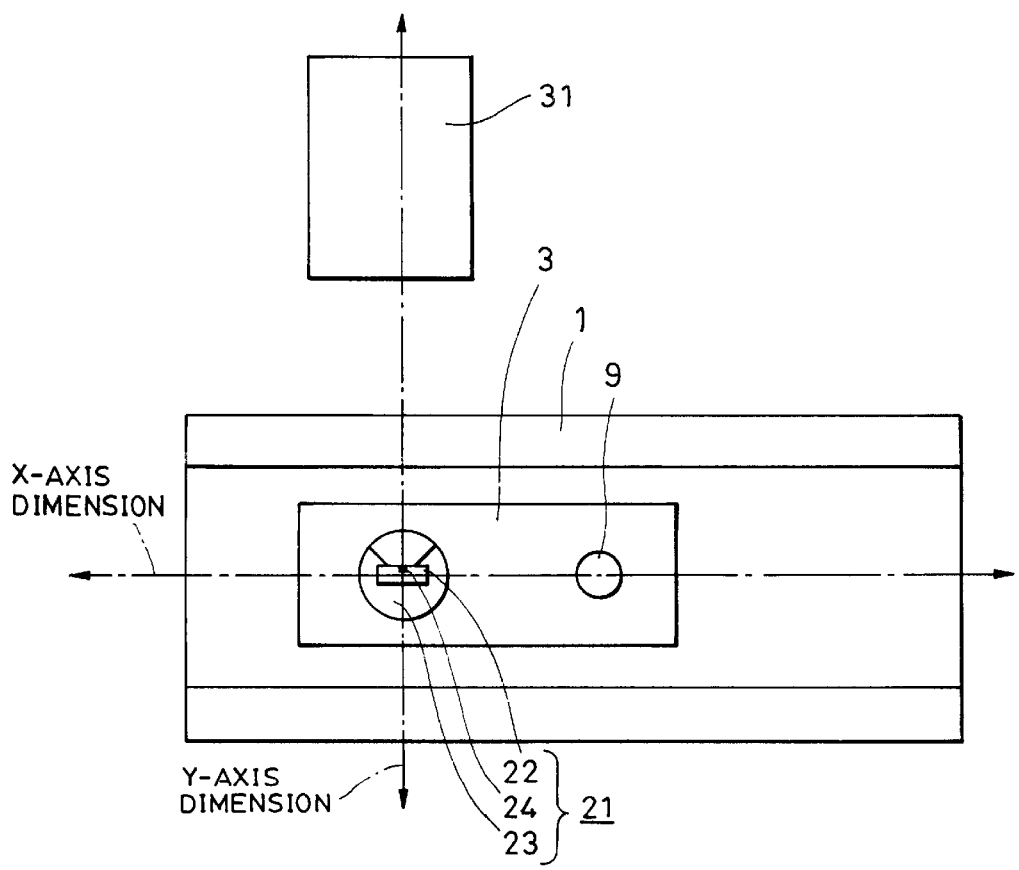
FIG. 8 is an enlarged view of portion A in FIG. 7.
Figure 12:
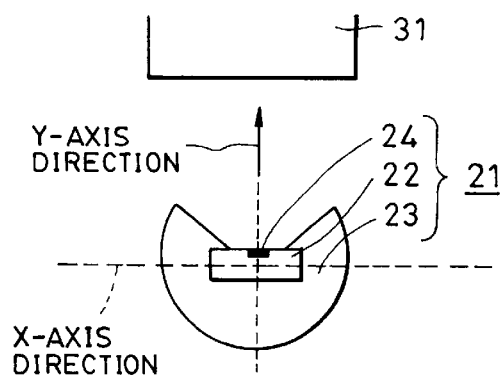
FIG. 12 is a plan view of an example of a specimen to be subjected to sectional TEM observation produced by the FIB method.
Figure 13:
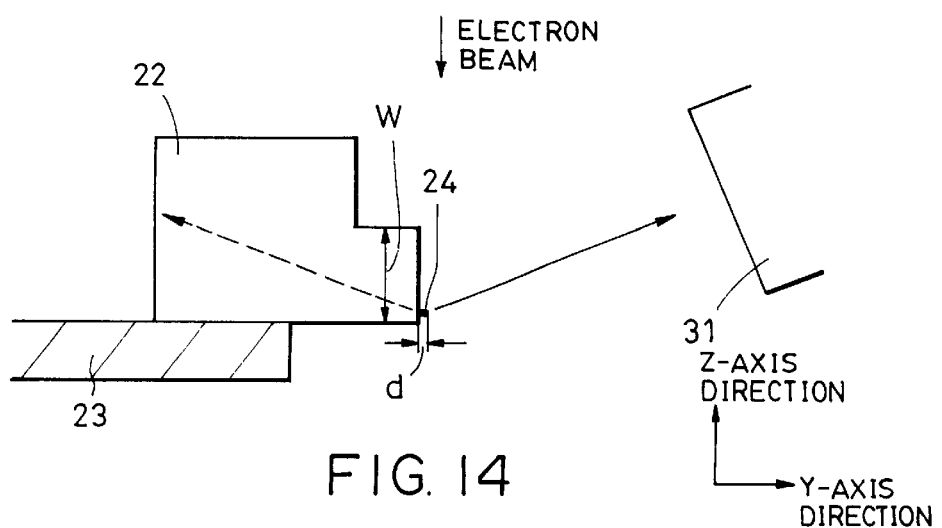
FIG. 13 is a sectional view of the specimen of FIG. 12 along the Y-axis direction.
Figure 14:
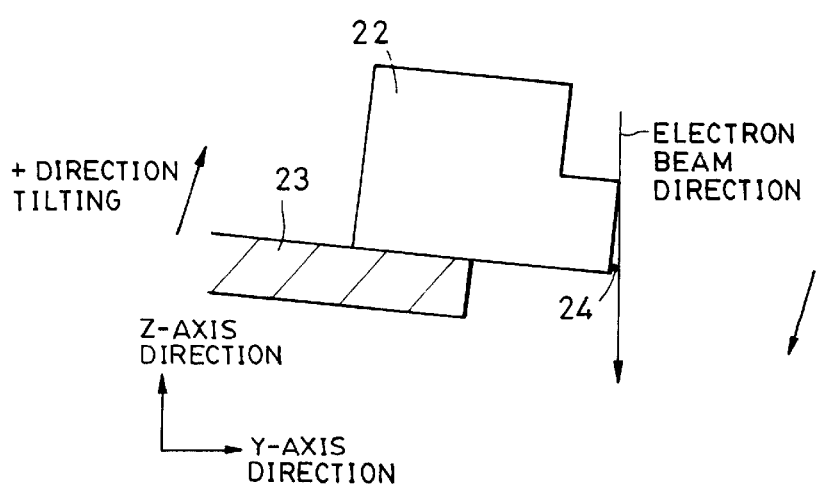
FIG. 14 is a sectional view of a condition in which the specimen of FIG. 12 cannot be subjected to TEM observation.
Figure 15:
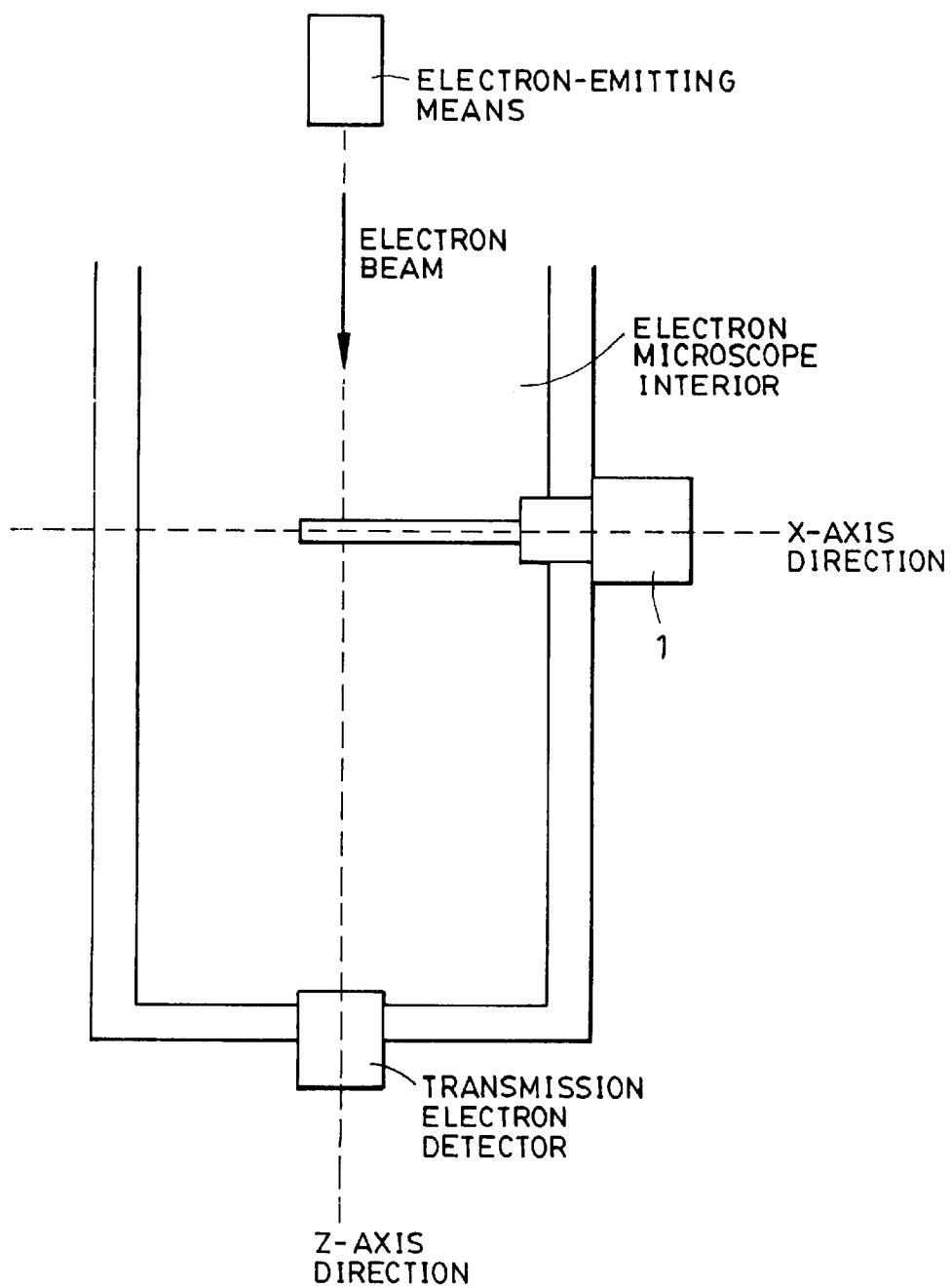
FIG. 15 is a schematic view of an electron microscope device.

With reference to FIGS. 12 to 14, a description of an example of a specimen to be subjected to sectional TEM observation produced by the FIB method will be given. FIG. 12 is a plan view schematically illustrating the specimen 21. FIG. 13 is a sectional schematic view of the specimen 21 along the Y-axis direction. FIG. 14 is a sectional schematic view of a condition in which the specimen 21 cannot be subjected to TEM observation. The X-axis direction and the Y-axis direction in FIG. 12 and the X-axis direction and the Y-axis direction in FIGS. 8 and 15 represent the same respective directions.

Each of the elements shown in block outline in the figures is well known per se, and a specific type of construction is not critical to carrying out the invention or to a disclosure of the best mode for carrying out the invention.

An observation portion 24 is formed by forming a portion of an L-shaped or convex specimen piece 22 into a thin portion by FIB processing. The specimen piece 22 is affixed to a meshed section 23 with a bonding material. Ordinarily, a meshed section with a portion thereof cut away, as illustrated in FIG. 12, is used. By irradiating the observation portion 24 from thereabove (or from a direction perpendicular to the X and Y axes, that is, from a Z-axis direction) with electron beams, TEM observation and/or EDX analysis are/is executed.

The specimen 21 to be subjected to sectional TEM observation produced by the FIB method has a very distinctive form. Therefore, there are various restrictions when carrying out TEM observation or EDX analysis.

For example, as shown in FIG. 13, width W of the top portion of the protruding-type specimen piece 22 is large compared to depth d of the observation portion 24. The width W is usually of the order of tens of to a few hundred micrometers. The depth d is usually of the order of a few micrometers. FIGS. 13 and 14 are sectional schematic views in the Y-axis direction (or the Y-Z plane) of FIG. 12. Here, as shown in FIG. 14, even a slight increase in the tilting of the specimen piece 22 with respect to the electron beam prevents observation of the observation portion 24 with TEM because the area around the observation portion 24 moves into the shadow of a wall of the specimen piece 22. Since the area around the observation portion 24 is extremely thick, EDX analysis can be carried out when the X-ray analyzer 31 is disposed in the direction indicated by the solid arrow in FIG. 13. However, when the X-ray analyzer 31 is disposed in the direction indicated by the dotted line in FIG. 13, the thick specimen piece acts as a wall and blocks the X rays produced from the specimen 21, so that the EDX analysis cannot be carried out. Thus, when carrying out the EDX analysis, the specimen 21 is held by the specimen holder so that the X-ray analyzer 31 is disposed as shown in FIGS. 12 and 13.

As described above, in the case where a specimen is observed with the electron microscope device of FIG. 15, the form of the specimen may produce constraints on the tilting (or rotating) of the specimen, with, in particular, the X-axis direction defining the tilting axis (or the rotating axis). In addition, when a crystalline substrate is cut out in a direction in which the specimen is observed, and when it is necessary to align the orientation of the specimen when it is observed, the form of the specimen may produce constraints on the tilting of the specimen, with the X-axis direction defining the tilting axis. Considering the errors produced, for example, when bonding a specimen piece to a meshed section or when cutting away a portion of the specimen piece, the optimal tilting angle of the specimen (with the X-axis direction defining the tilting axis) during sectional TEM observation is often in the range of ±(3 to 10) degrees. The tilting angle can be substantially defined as the angle of the specimen-holding surface 11 from the Z-axis direction (or the direction in which the electron beams irradiate the specimen).

When EDX analysis is carried out using the above-described conventional specimen holder for an electron microscope, the following problems arise.

In the conventional specimen holder, the specimen-holding surface 11 of the specimen-holding table 2 is formed substantially parallel to the horizontal surface of the holder body 1. Therefore, the optimal tilting angle of the specimen itself when the X-axis direction of the specimen itself defines the tilting axis is essentially the same as that when the X-axis direction of the specimen holder itself is made to define the tilting axis. Consequently, in the case where the above-described specimen is used, when the X-axis direction of the specimen holder is made to define the tilting axis, the optimal tilting angle falls in the range of ±(3 to 10) degrees.

Figure 10:
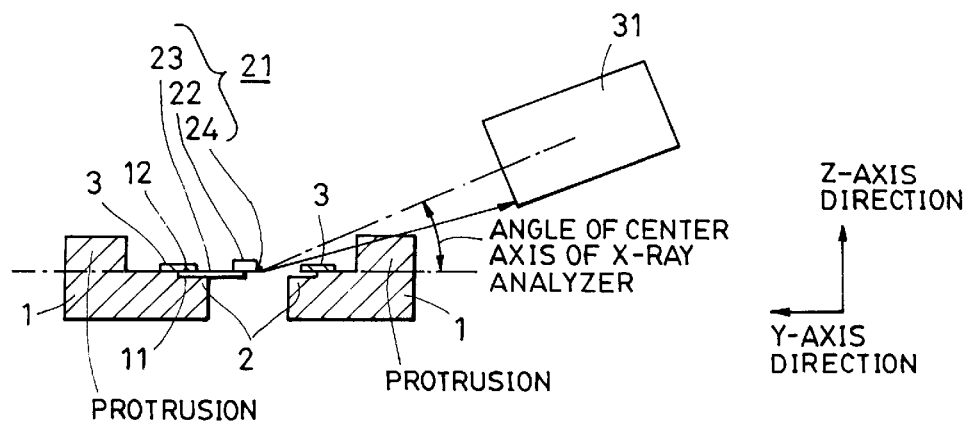
FIG. 10 is a sectional view along the Y-axis dimension of FIG. 8.

FIG. 10 illustrates the case where the tilting angle is of the order of zero degrees. Here, since the X rays produced from the observation portion 24 of the specimen 21 are intercepted by an edge (a protrusion) of the specimen holder, such problems as the efficiency with which the X rays produced from the specimen 21 being reduced or the X rays not being detected may occur. In order to make the sensitivity with which the X-rays are detected high, it is preferable to dispose the center axis of the X-ray analyzer 31 at a small angle of from about 15 degrees to 30 degrees from the specimen-holding surface 11. In, for example, FIG. 10, the X-rays produced in the direction of the arrow are intercepted by an edge (a protrusion) of the specimen holder.

The above-described problems become more noticeable as the optimal tilting angle in which the X-axis direction of the specimen holder defines the tilting axis becomes smaller.

To eliminate these problems, a specimen holder in which a side of the edge or protrusion near the X-ray analyzer 31 is cut away is sometimes used. However, this results in such problems as the reduction of the mechanical strength of the specimen holder and of the freedom with which the specimen can be designed when the specimen holder is made to have the above-described various functions. Hereunder, a description of preferred embodiments of the present invention will be given with reference to the drawings.

Figure 1:
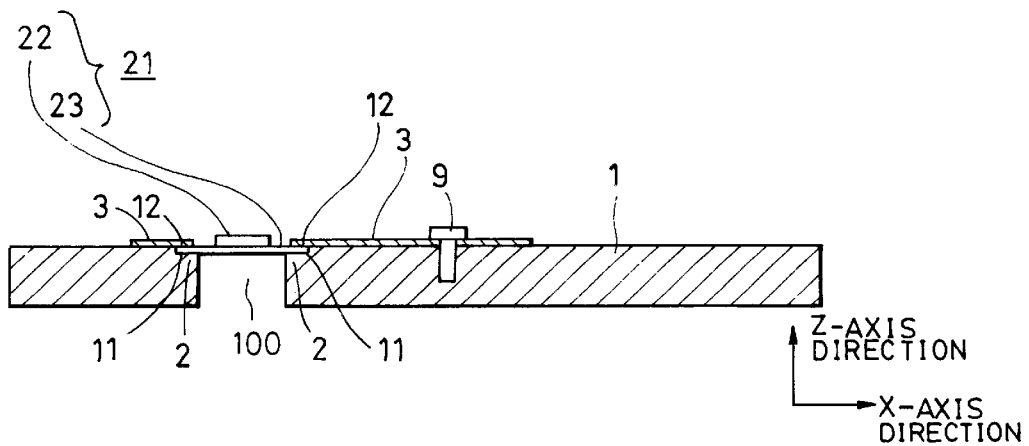
FIG. 1 is a sectional view of an embodiment of the specimen holder for an electron microscope in accordance with the present invention along an X-axis direction.
Figure 2:
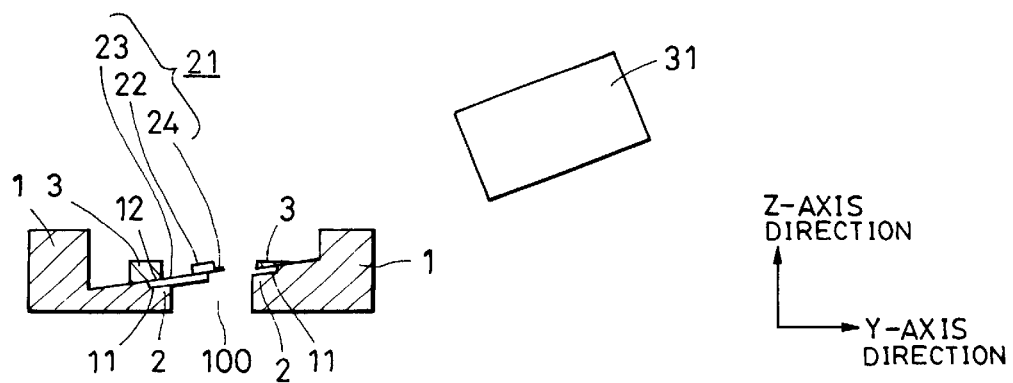
FIG. 2 is a sectional view of the embodiment of the holder in accordance with the present invention along a Y-axis direction.
Figure 3:
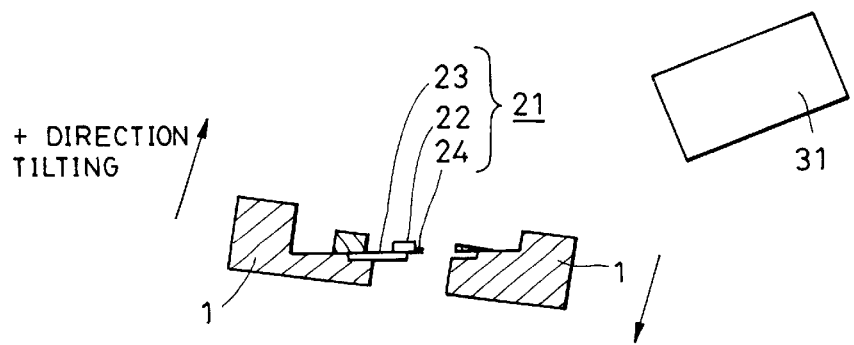
FIG. 3 is a sectional view of the holder being tilted from the state in FIG. 2, with the X-axis a'a center.
Figure 7:
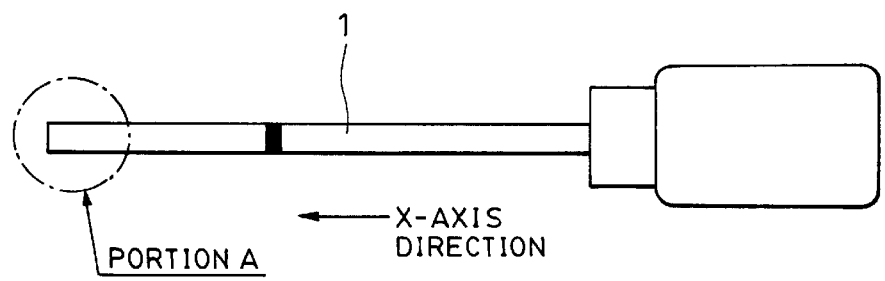
FIG. 7 is a plan view schematically showing a conventional specimen holder for an electron microscope.

FIG. 1 is a sectional schematic view of a first embodiment of the specimen holder along an X-axis direction (or an X-Z plane) thereof. FIG. 2 is a sectional view along an Y-axis direction (or an Y-Z plane) thereof. FIG. 3 is a sectional view of the holder being tilted (rotated) from the state in FIG. 2, with the X-axis serving as a center. As shown in FIGS. 7 and 15, the specimen holder of the present invention is basically a side-entry type holder. The plan view of the first embodiment of the specimen holder and the enlarged plan view of the portion corresponding to portion A of the holder body are essentially the same as the plan view of FIG. 7 and the enlarged plan view of FIG. 8 illustrating the conventional specimen holder, respectively. Component parts of the first embodiment specimen holder similar to those of the conventional specimen holder will be given the same reference numerals and described below.

In all the figures, the X-axis directions, the Y-axis directions, and the Z-axis directions are represented consistently throughout; and component parts given the same reference numerals refer to similar component parts.

Referring to FIGS. 1 to 3, the specimen holder of the first embodiment comprises a holder body 1 in which the longitudinal direction thereof is in the X-axis direction; a specimen-holding table 2 for holding a specimen; and a specimen holding-down means 3. Reference numeral 100 represents an opening for passing therethrough electron beams irradiated from the Z-axis direction, as shown in FIG. 15.

Although a specimen holder in which the specimen-holding table 2 is integrally formed with the holder body 1 is used, the holder of the present invention may include a mechanism for tilting (or rotating) the specimen-holding table 2 from the holder body 1, with the Y-axis direction defining the rotational (or tilting) axis. Mechanisms disclosed in Japanese Patent Laid-open No. 11-18586 and U.S. Pat. No. 5,367,171 may be used as the above-described Y-axis-direction tilting mechanism. So, the pertinent disclosures are incorporated by reference herein.

The specimen 21 is held by being sandwiched between the specimen-holding table 2 and the specimen holding-down means 3. Reference numeral 12 denotes a specimen-holding surface of the specimen holding-down means 3. In the embodiment, the specimen holding-down means 3 is secured to the specimen-holding table 2 by a screw 9 in order to hold the specimen 21. As shown in FIG. 2, with the holder body 2 being positioned horizontally and the longitudinal direction (or the X-axis direction) of the holder body 1 defining the center axis of tilting, the specimen-holding surface 11 of the specimen-holding table 2 is tilted. There is disposed an X-ray analyzer 31 having a center axis extending in a direction perpendicular to the longitudinal direction of the holder body 1, that is, in the Y-axis direction. The specimen-holding surface 11 of the specimen-holding table 2 is tilted from the X-ray analyzer 31 so that a side of the specimen-holding surface 11 of the specimen-holding table 2 nearest to the X-ray analyzer 31 becomes closer to the X-ray analyzer 31. The specimen holding-down means 3 includes a specimen-holding surface 12 which is correspondingly tilted with the tilted specimen-holding surface 11 of the specimen-holding table 2.

A description of a second embodiment of the specimen-holder in accordance with the present invention will now be given.

Figure 4:
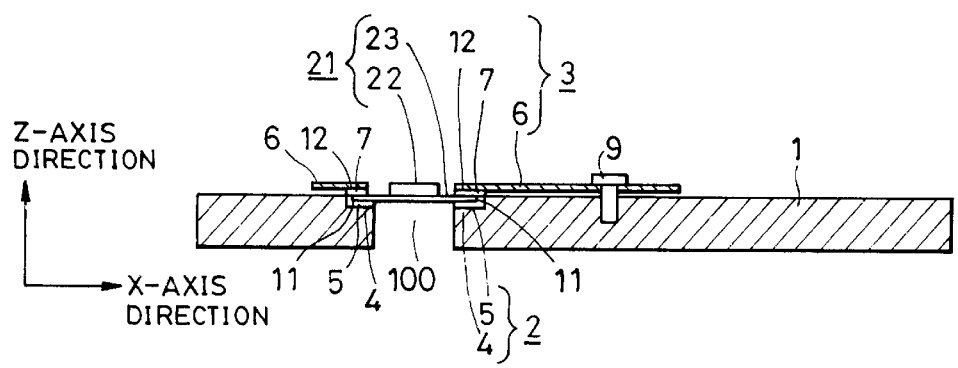
FIG. 4 is a sectional view of another embodiment of the specimen holder for an electron microscope in accordance with the present invention along the X-axis direction.
Figure 5:
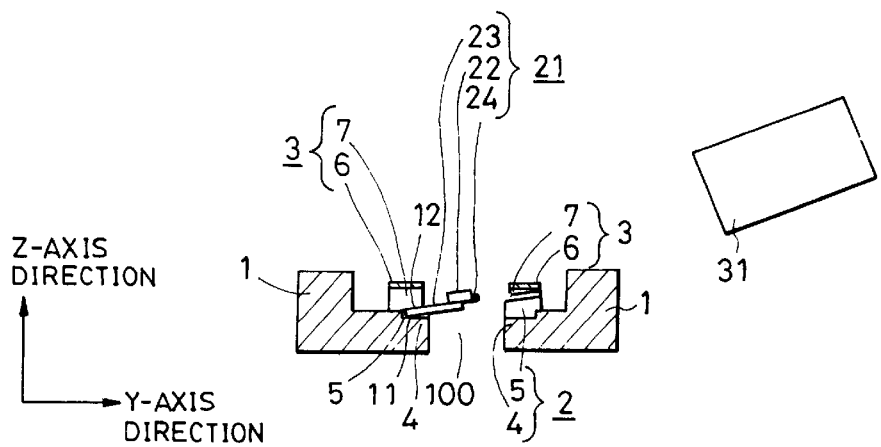
FIG. 5 is a sectional view of the embodiment of the specimen holder for an electron microscope in accordance with the present invention along the Y-axis direction.
Figure 6:
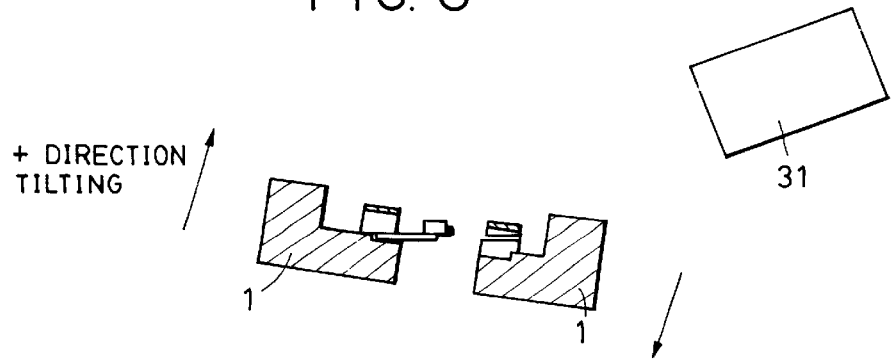
FIG. 6 is a sectional view of the holder being tilted from the state in FIG. 5, with the X-axis as a center.

FIG. 4 is a sectional schematic view of a second embodiment of the specimen holder along an X-axis direction (or an X-Z plane) thereof. FIG. 5 is a sectional schematic view along a Y-axis direction (or a Y-Z plane) thereof. FIG. 6 is a sectional view of the holder being tilted from the state in FIG. 5, with the X-axis as a center.

The specimen holder of the second embodiment differs from that of the first embodiment in the structures of the specimen-holding table 2 and the specimen holding-down means 3. As shown in FIGS. 4 to 6, the specimen-holding table 2 comprises a specimen-holding-table base section 4 formed integrally with the holder body 1, and a specimen-holding-table spacer 5 removably mounted to the specimen-holding-table base section 4. A specimen-holding surface 11 is formed at the specimen-holding-table spacer 5. Similarly to the specimen-holding surface 11 in the first embodiment, with the holder body 1 being positioned horizontally and with the longitudinal direction (or the X-axis direction) of the holder body 1 defining the center axis of tilting, the specimen-holding surface 11 is tilted. An X-ray analyzer 31 is disposed facing the direction perpendicular to the longitudinal direction of the holder body 1 (or the Y-axis direction). The specimen-holding surface 11 is tilted from the X-ray analyzer 31 so that a side of the specimen-holding surface 11 of the specimen-holding-table spacer 5 nearest to the X-ray analyzer 31 becomes closer to the X-ray analyzer 31.

The specimen holding-down means 3 comprises a specimen-holding-down-means base section 6 and a specimen-holding-down-means spacer 7 removably mounted to the specimen-holding-down-means base section 6. A specimen-holding surface 12 is formed at the specimen-holding-down-means spacer 7. The specimen 21 is held by sandwiching it between the specimen-holding-table spacer 5 and the specimen-holding-down-means spacer 7. The specimen-holding surface 12 at the specimen-holding-down-means spacer 7 is correspondingly tilted with the tilted specimen-holding surface 11 of the specimen-holding-table spacer 5.

The specimen holder of the second embodiment can produce similar effects to those of the specimen holder of the first embodiment illustrated in FIGS. 1 to 3.

The present invention includes the case where the specimen-holding table 2 of the conventional specimen holder for an electron microscope is used as the specimen-holding-table base section 4, and the specimen-holding-down-table spacer 5 of the present invention is used as an additional component part. Similarly, the present invention includes the case where the specimen-holding-down means 3 of the conventional specimen holder for an electron microscope is used as the specimen-holding down-means base section 6, and the specimen-holding-down-means spacer is used as an additional component part.

The size of the tilting angle of the specimen-holding surface of the specimen-holding table (or the specimen-holding-table spacer) of the present invention as well as the size of the tilting angle of the specimen-holding surface of the specimen-holding-down means (or the specimen-holding-down-means spacer) depend on, for example, the permissible tilting angle of the goniometer of the electron microscope and the form of the specimen holder. Thus, it is preferable that the tilting angles be in the range of from 1 to 25 degrees. However, the tilting angles are not particularly limited. Angles of any size may be used as long as they do not cause problems in TEM observation and EDX analysis.

As shown in FIGS. 1, 2, 4, 5, and 16, in a section along a direction substantially perpendicular to the longitudinal direction (or the X-axis direction) of the specimen holder, that is, along the Y-axis direction, each specimen holder comprises a specimen-holding table 2 including a specimen-21-placing plane (or a supporting-holding surface 11) and a pair of protruding members (protruding portions) protruding beyond the specimen-21-placing plane (or the specimen-holding surface 11) and having the supporting-holding table 2 disposed therebetween. The specimen-holding surface 11 of each specimen-holding table 2 (corresponding to the top surface of each specimen-holding table 2 where each specimen 21 or each meshed section 23 is placed) is formed at an angle from (that is, not parallel to) a plane including top portions (or top surfaces or topmost portions) of the protruding members protruding beyond each specimen-placing plane.

In the present invention, the angle θ (see FIG. 16) between the specimen-holding surface 11 of the specimen-holding table 2 (that is, the top surface of the specimen-holding table 2 where the specimen 21 or the meshed section 23 is placed) and the plane including the top portions (or the top surfaces or the topmost portions) of the protruding members or protruding portions protruding beyond the specimen-placing plane is less than 45 degrees. It is preferably in the range of from 1 to 25 degrees inclusive.

Figure 16:
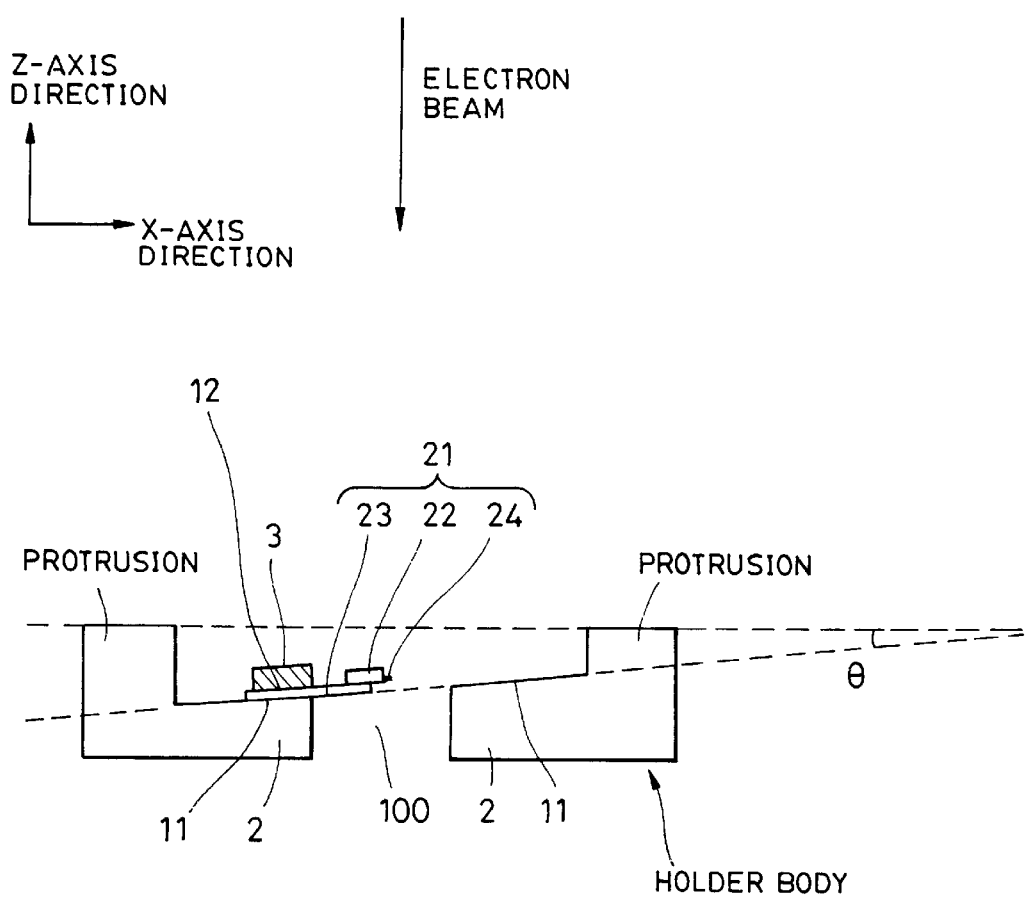
FIG. 16 is a schematic view of the structure of the specimen holder in accordance with the present invention.

In other words, as shown in FIGS. 2, 4, and 16, in a section along a direction substantially perpendicular to the longitudinal direction (or the X-axis direction) of the specimen holder, that is, along the Y-axis direction, each specimen holder comprises a holding table 2 including a specimen-21-placing plane (or a specimen-holding surface 11) and a pair of protruding members (protruding portions) having the specimen-holding table 2 disposed therebetween and protruding beyond the specimen-placing plane (or the specimen-holding surface 11). The specimen-holding surface 11 of each specimen-holding table 2 (that is, the top surface of each specimen-holding table 2 where each specimen 21 or each meshed section 23 is placed) is formed at an angle from (that is, not parallel to) a line connecting the top portions (or top surfaces or topmost portions) of the corresponding protruding members or protruding portions protruding beyond each specimen-placing plane.

In the present embodiment, the angle θ' (see FIG. 16) between the specimen-holding surface 11 of each specimen-holding table 2 (that is, the top surface of each specimen-holding table 2 where each specimen 21 or each meshed section 23 is placed) and the line connecting the top portions (or the top surfaces or the topmost portions) of the corresponding protruding members or protruding portions protruding beyond each specimen-placing plane is less than 45 degrees. It is preferably in the range of from 1 to 25 degrees inclusive.

Hereunder, a description of a third embodiment of the holder in accordance with the present invention will be given.

Figure 17:
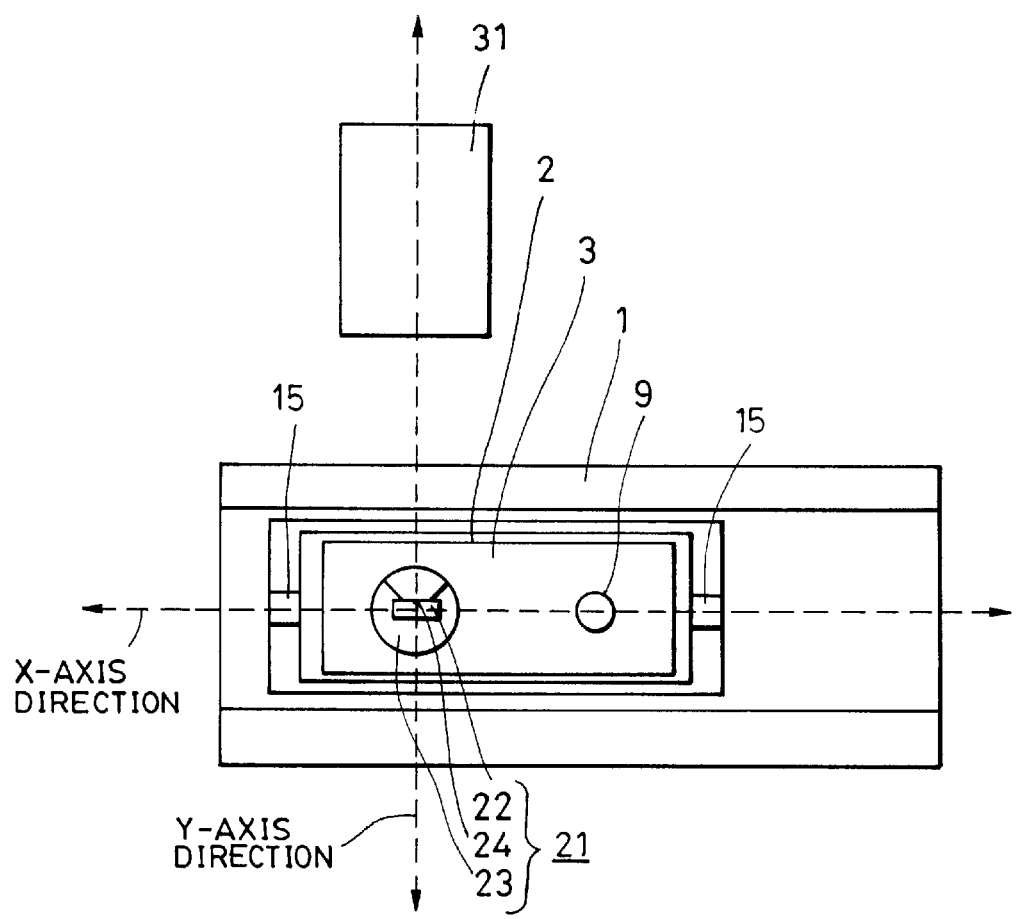
FIG. 17 is a plan view schematically showing still another embodiment of the specimen holder in accordance with the present invention.
Figure 18:
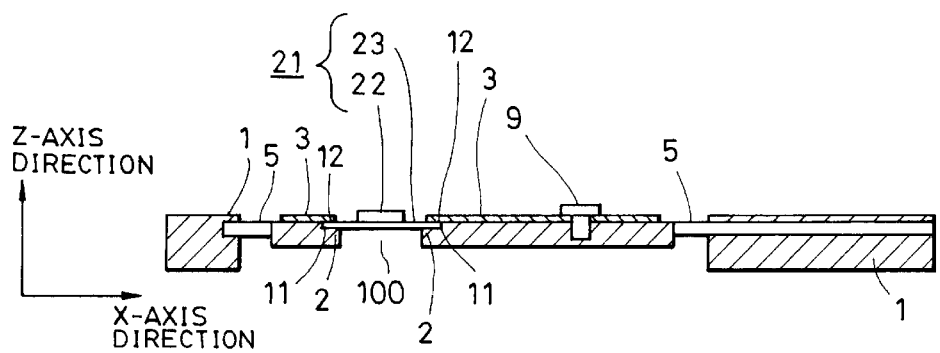
FIG. 18 is a sectional schematic view of the holder of FIG. 17 along the X-axis direction.
Figure 19:
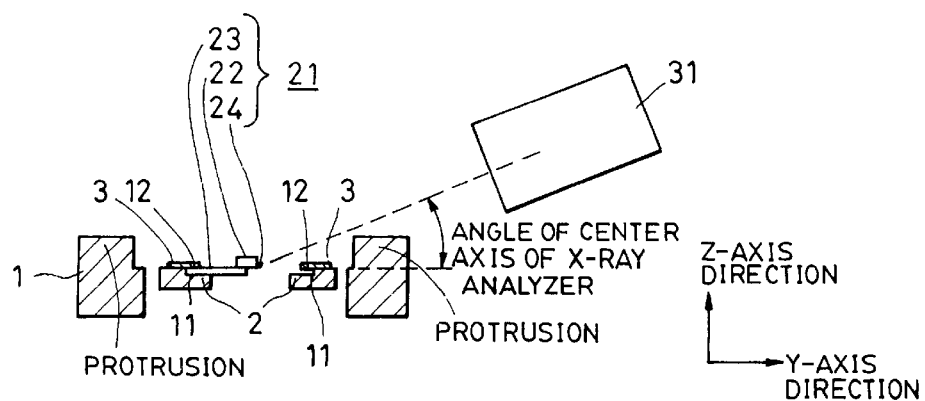
FIG. 19 is a sectional schematic view of the holder of FIG. 17 along the Y-axis direction.

FIG. 17 is a schematic (X-Y) plan view of the third embodiment of the holder in accordance with the present invention. FIG. 18 is a sectional schematic view in an X-Z plane along an X-axis dimension of FIG. 17. FIG. 19 is a sectional schematic view in an Y-Z plane along an Y-axis dimension of FIG. 17.

As shown in FIGS. 17 to 20, the specimen holder of the third embodiment primarily comprises a holder body 1, a specimen-holding table 2 for holding a specimen, a specimen holding-down means 3, and a specimen-tilting (or specimen-rotating) mechanism 15 for tilting (or rotating) the specimen-holding table 2. The specimen-holding table 2 and the holder body 1 are not integrally formed, but connected to each other through the specimen-tilting mechanism 15. In the third embodiment, the holder body 1 is a frame-shaped body which surrounds the specimen-holding table 2. The specimen-tilting mechanism 15 is disposed between the holder body 1 and the specimen-holding table 2. A specimen 21 is held by being sandwiched between the specimen-holding table 2 and the specimen holding-down means 3. The specimen holding-down means 3 is secured to the specimen-holding table 2 with a screw 9 in order to hold the specimen 21.

With the longitudinal direction (or the X-axis direction) of the holder body 1 defining the center axis of tilting, the specimen-holding table 2 is tilted by the tilting mechanism 15. A specimen-holding surface 11 of the specimen-holding table 2 and a specimen-holding surface 12 of the specimen holding-down means 3 are formed so that they are parallel to a horizontal surface of the holder body 1 when the angle by which the specimen-holding 2 is tilted by the tilting mechanism 15 is zero.

In other words, as shown in FIGS. 17 to 19, in a section along a direction substantially perpendicular to the longitudinal direction (or the X-axis direction) of the specimen holder (the specimen-supporting means), that is, along the Y-axis direction, the holder of the third embodiment comprises a specimen-holding table 2 including a specimen-21-placing plane (or a specimen-holding surface 11) and a pair of members having the specimen-holding table 2 disposed therebetween. The specimen-holding table 2 is held by the pair of members so that it can change its position relative to the pair of members (or so that it can move relative to the pair of members). For the direction of change of movement, the longitudinal direction (or the X-axis direction) of the specimen holder is defined as the axis of movement.

In the third embodiment, on the one hand, the holder body 1 can be tilted by a goniometer (not shown) installed in the electron microscope, with the longitudinal direction (or the X-axis direction) thereof being the center axis of tilting; and, on the other hand, the specimen-holding table 2 can be separately tilted by the tilting mechanism 15, with the longitudinal direction (or the X-axis direction) of the holder body 1 as the center axis of tilting.

There are various methods which may be used to hold the specimen by the specimen holder for an electron microscope in accordance with the present invention. In one method, the specimen is held by sandwiching it between a specimen-holding table and a specimen holding-down means as a result of securing the specimen holding-down means to the specimen-holding table with a screw. In another method, the specimen is held by sandwiching the specimen between a specimen-holding table provided with a screw and a specimen holding-down means with a screw. In still another method, the specimen is held by sandwiching the specimen between a specimen holding-down means formed as an annular spring and a specimen-holding table including a receiving section. In still another method, the specimen is held by sandwiching it by a gap-like specimen holding-down means so that it surrounds a specimen-holding table. However, specimen-holding methods which may be used are not limited to these particular methods. Any other method may be used as long as it does not cause problems in TEM observation and EDX analysis.

Materials which may be used to form the specimen-holding table (that is, the specimen-holding-table base section and the specimen-holding-table spacer) and the specimen holding-down means (that is, the specimen-holding-down-means base section and the specimen-holding-down-means spacer) include non-magnetic materials with sufficient mechanical strength, such as phosphor bronze, beryllium, and carbon. However, the materials which may be used are not limited to these particular examples. Any other type of material may be used as long as it does not cause problems in TEM observation and EDX analysis.

There are other types of specimen holders in addition to the above-described specimen holders for an electron microscope that may be used in accordance With the present invention. They include a biaxially tilting specimen holder, a specimen cooling holder, a specimen heating holder, and a specimen pulling holder, and a combination of some or all of these specimen holders. The biaxially tilting specimen holder includes a mechanism for tilting the specimen-holding table, with a direction perpendicular to the longitudinal direction of the holder body defining the center axis of tilting. The cooling specimen holder includes a mechanism for cooling the specimen. The heating specimen holder includes a mechanism for heating the specimen. The pulling specimen holder has the function of pulling the specimen. However, the specimen holders which may be used are not limited to these particular specimen holders. Any other type of specimen holder may be used as long as it does not cause problems in TEM observation and EDX analysis.

According to the present invention, in addition to the conventional biaxially tilting specimen holder, specimen heating holder, specimen cooling holder, specimen pulling holder, etc., a specimen holder including either one or both of the specimen-holding-table spacer and the specimen-holding-down-means spacer used in the present invention may also be used.

The above-described embodiments of the present invention will be described in more detail by giving numerical values, materials, etc.

First Embodiment

The first embodiment specimen holder for an electron microscope illustrated in FIGS. 1 to 3 was produced. As shown in FIG. 2, the specimen-holding surface 11 of the specimen-holding table 2 was tilted by −10 degrees, with the X-axis direction of the specimen holder defining the tilting axis. The specimen-holding surface 12 of the specimen holding-down means 3 was a surface correspondingly inclined with the specimen-holding surface 11 of the specimen-holding table 2. As shown in FIG. 2, the X-ray analyzer 31 was made to face a direction perpendicular to the X-axis direction of the holder body 1, that is, the Y-axis direction thereof. As shown in FIG. 2, the center axis of the X-ray analyzer 31 was tilted at an angle of 20 degrees from the bottom surface (or the horizontal surface) of the holder body 1. This means that it was tilted at an angle of 20 degrees from the line connecting the top portions (or the top surfaces or the topmost portions) of the pair of protruding members or protruding portions having the specimen-holding table 2 disposed therebetween, or from the plane including the top portions of the pair of protruding members or protruding portions having the specimen-holding table disposed therebetween. As shown in FIGS. 12 to 14, the specimen 21 is a specimen of a silicon semiconductor device to be sectionally observed produced by the FIB method.

With the X-axis and Y-axis directions defining the corresponding center axes, the tilting angles suitable for TEM observation of a specimen was substantially zero degrees. As shown in FIG. 3, when, with the X-axis direction of the specimen holder defining the tilting axis, the specimen holder body 1 was tilted by an angle of +10 degrees by use of a goniometer, the specimen was set at an optimal angle for TEM observation, so that TEM observations were properly carried out. EDX analysis was carried out by use of the X-ray analyzer 31 in the same condition of the TEM observation (tilted at an angle of 10 degrees). It was found that the X-ray analyzer 31 had good X-ray detecting sensitivity.

Second Embodiment

The second embodiment specimen holder for an electron microscope and spacers shown in FIGS. 4 to 8 were produced. The second embodiment specimen holder was exactly the same as the first embodiment specimen holder except that the specimen-holding table 2 includes a specimen-holding-table base section 4 formed integrally with a holder body 1, and a specimen-holding-table spacer 5 which can be removed from the specimen-holding-table base section 4 and which includes a tilted specimen-holding surface 11; and that the specimen holding-down means 3 includes a specimen-holding-down-means base section 6 and a specimen-holding-down-means spacer 7 which can be removed from the specimen-holding-down-means section 6 and which includes a titled specimen-holding surface 12. The placement of the X-ray analyzer, the condition of the specimen, the direction in which the specimen is held, and the tilting of the specimen holder body by the goniometer were essentially the same as those in the first embodiment specimen holder. As in the first embodiment, when the second embodiment holder was used, TEM observation and EDX analysis were properly carried out.

Comparative Examples

Figure 9:
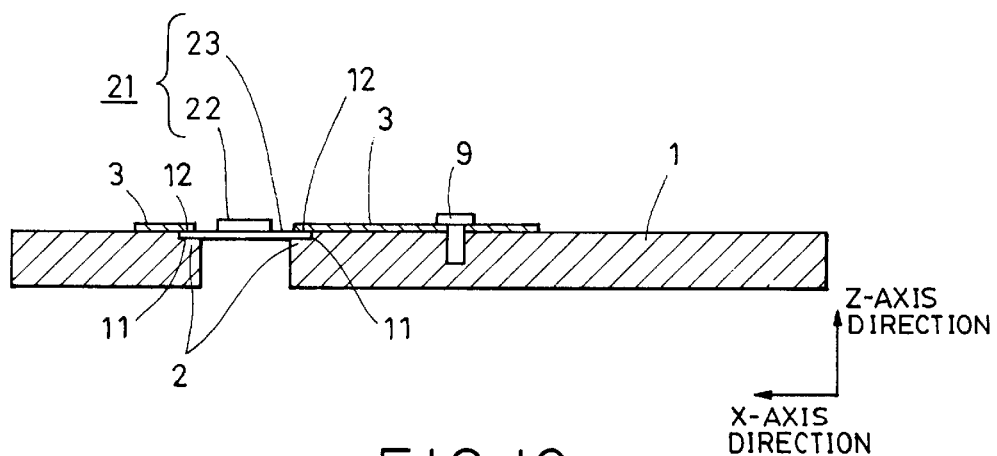
FIG. 9 is a sectional view along the X-axis dimension of FIG. 8.
Figure 11:
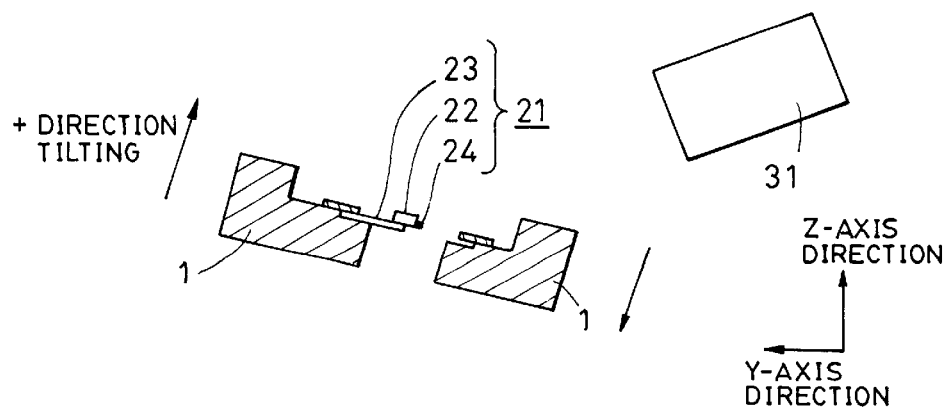
FIG. 11 is a sectional view of the holder being tilted from the state in FIG. 10, with the X-axis as a center.

The specimen holder illustrated in FIGS. 7 to 11 was produced in order to compare it with the specimen holders of the above-described embodiments. As shown in FIGS. 9 and 10, the specimen-holding surface 11 of the specimen-holding table 2 and the specimen-holding surface 12 of the specimen holding-down means 3 were formed parallel to the horizontal surface of the holder body 1. The placement of the X-ray analyzer 31, the condition of the specimen, and the direction in which the specimen is held were essentially the same as those in the first embodiment specimen holder. When, with the X-axis direction of the specimen holder defining the tilting axis, the holder body 1 was tilted by +10 degrees as a result of tilting the specimen by a goniometer as shown in FIG. 11, the area around the observation portion 24 moved into the shadow of a wall of the specimen piece 22 as shown in FIG. 14, making it impossible to observe the observation portion 24 using TEM.

Accordingly, the holder body 1 was returned to a 0 degree tilt by use of a goniometer as shown in FIG. 10, and the specimen was set at an optimal angle for TEM observation, so that TEM observations were properly carried out. Then, EDX analysis was carried out by use of the X-ray analyzer 31. It was found that the X-ray analyzer 31 did not have good X-ray detecting sensitivity.

Third Embodiment

The third embodiment specimen holder illustrated in FIGS. 17 to 19 was produced. The specimen-holding table 2 was connected to the holder body 1 through a tilting mechanism 15. With the longitudinal direction (or the X-axis direction) of the holder body 1 defining the center axis of tilting, the specimen 21 was tilted by the tilting mechanism 5.

As shown in FIG. 17, the X-ray analyzer 31 was disposed so as to face a direction perpendicular to the X-axis direction of the holder body 1, that is, to the Y-axis direction. The angle of the center axis of the X-ray analyzer 31 was at an angle of 20 degrees from the holder body 1 in a horizontal posture. The specimen 21 used was the same as that used in the first and second embodiments. That is, it was a specimen to be observed sectionally of a silicon semiconductor device produced by the FIB method. With the X- and Y-axis directions defining the center axes of tilting, the tilting angles suitable for TEM observation of the specimen were substantially zero degrees.

Figure 20:
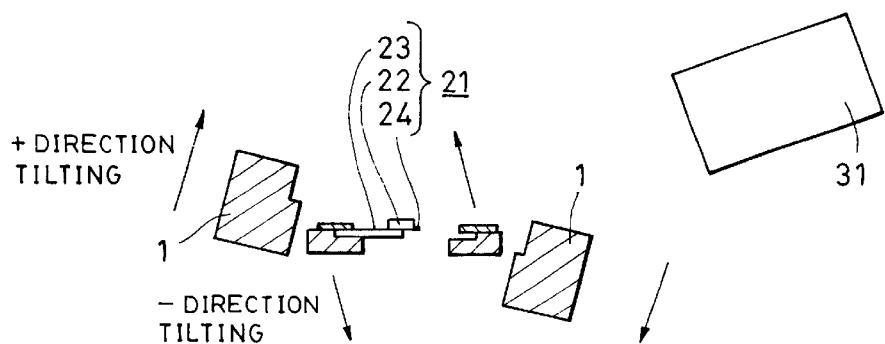
FIG. 20 is a sectional schematic view of the holder of FIG. 17 being tilted, with the X-axis as a center.

In the third embodiment, as shown in FIG. 20, with the X-axis direction of the holder body 1 defining the center axis of tilting, the specimen-holding table 2 was tilted by an angle of the order of −10 degrees as a result of tilting the specimen by the specimen-tilting mechanism 15. At the same time, with the X-axis direction of the specimen holder defining the center axis of tilting, the holder body 1 was tilted by an angle of the order of +10 degrees by use of a goniometer. When the specimen-holding table 2 and the holder body 1 were tilted, the specimen was tilted at a suitable angle for TEM observation, with the X-axis direction defining the center axis of tilting. When the third embodiment specimen holder was used, TEM observation and EDX analysis were properly carried out.

Comparative Example

Under the same conditions (wherein the specimens were placed at the same location, the specimens were irradiated with electron beams, the EDX measuring times were the same, etc.), EDX analysis was carried out in order to compare SiKα-line strengths. It was found that those strengths of the first, second, and third embodiments were at least 1.5 times that of the comparative specimen holder illustrated in FIGS. 7 to 11.

As can be understood from the foregoing description, in each specimen holder for an electron microscope in accordance with the present invention and the spacers thereof, each specimen-holding surface is not formed parallel to the horizontal surface of its corresponding holder body, but is tilted, with the longitudinal direction (or the X-axis direction) of the corresponding specimen holder defining the corresponding tilting axis. In addition, each specimen-holding surface is tilted so that a side of the corresponding specimen-holding surface nearest to its corresponding X-ray analyzer becomes nearest to the corresponding X-ray analyzer. Therefore, even when the suitable tilting angle of the specimen for TEM observation is small, the tilting angle of each specimen holder itself can be made larger by using, for example, a goniometer of the electron microscope. Each specimen holder for an electron microscope in accordance with the present invention comprises a mechanism for tilting the corresponding specimen-holding table, with the longitudinal direction (or the X-axis direction) of the specimen-holding surface defining its corresponding center axis of tilting. In each specimen holder, when the tilting mechanism for tilting its corresponding specimen-holding table is used, the tilting angle of the corresponding specimen-holding table or the specimen itself (with the X-axis direction of the specimen-holding surface defining the center axis of tilting) can be made different from the tilting angle of the holder body tilted by a goniometer (with the X-axis direction of the specimen holder itself defining the center axis of tilting). Therefore, by tilting the specimen-holding table in one direction using the tilting mechanism of the specimen holder and, at the same time, by tilting the specimen holder itself in the opposite direction using a goniometer, the tilting angle of the specimen holder itself can be made larger even when the tilting angle suitable for TEM observation of the specimen itself is small. Consequently, it is possible to eliminate the problems of X-rays produced from the specimen during EDX analysis being intercepted by an edge of the specimen holder, and to mitigate the problem of detection efficiency where the X-rays produced from the specimen are reduced or the X-rays are not detected.

This is particularly beneficial when carrying out EDX analysis of a specimen, such as that produced by the FIB method to be sectionally observed with TEM, having a small optimal tilting angle during TEM observation, with the X-axis direction of the specimen, itself, defining the tilting axis.

What is claimed is:

1. A specimen holder comprising:
   a holder body having a longitudinal direction;
   a specimen-holding table supported by said holder body, said specimen-holding table having a specimen-holding surface for placing a specimen thereon; and
   a specimen holding-down means for holding down the specimen on said specimen-holding table;
   wherein when said holder body is in a horizontal posture, said specimen-holding surface is tilted about a center axis of tilting, wherein the center axis of tilting is parallel to the longitudinal direction of said holder body.

2. A specimen holder according to claim 1, wherein when detecting an X-ray from the specimen, an X-ray analyzer is disposed above the specimen holder on a plane parallel to an electron beam direction and perpendicular to the longitudinal direction of said holder body, and
   said specimen-holding surface is tilted in a way that a side of said specimen-holding surface nearest to the X-ray analyzer becomes closer to the X-ray analyzer.

3. A specimen holder according to claim 1, wherein said specimen holding-down means includes a specimen-holding surface which is correspondingly tilted with said tilted specimen-holding surface.

4. A specimen holder according to claim 2, wherein said specimen holding-down means includes a specimen-holding surface which is correspondingly tilted with said tilted specimen-holding surface.

5. A specimen holder according to claim 1, further comprising a mechanism for tilting said specimen-holding table, with a direction substantially perpendicular to the longitudinal direction of said holder body defining a center axis of tilting.

6. A specimen holder according to claim 2, further comprising a mechanism for tilting said specimen-holding table, with a direction substantially perpendicular to the longitudinal direction of said holder body defining a center of axis of tilting.

7. A specimen holder according to claim 1, wherein said specimen-holding table is formed integrally with said holder body.

8. A specimen holder according to claim 2, wherein said specimen-holding table is formed integrally with said holder body.

9. A specimen holder according to claim 1, wherein said specimen-holding table comprises a specimen-holding-table base section formed integrally with said holder body, and a specimen-holding-table spacer having said specimen-holding surface and being removable from said specimen-holding-table base section.

10. A specimen holder according to claim 2, wherein said specimen-holding table comprises a specimen-holding-table base section formed integrally with said holder body, and a specimen-holding-table spacer having said specimen-holding surface and being removable from said specimen-holding-table base section.

11. A specimen holder according to claim 1, wherein said specimen holding-down means comprises a specimen-holding-down means base section and a specimen-holding-down means spacer having a specimen-holding surface and being removable from said specimen-holding-down means base section.

12. A specimen holder according to claim 2, wherein said specimen-holding-down means comprises a specimen-holding-down means base section and a specimen-holding-down means spacer having a specimen-holding surface and being removable from said specimen-holding-down mans base section.

13. A specimen-holder spacer used in a specimen holder comprising a holder body, a specimen-holding table provided at the holder body and used to place a specimen thereon, and a specimen-holding-down means for holding down the specimen on the specimen holding table, said spacer comprising:
   a specimen-holding surface for placing the specimen thereon and being removable from the specimen-holding table, wherein when the holder body is in a horizontal posture, said specimen-holding surface mounted to the specimen-holding table is titled, with a substantially longitudinal direction of the holder body defining a center axis of tilting.

14. A specimen-holder spacer according to claim 13, wherein an X-ray analyzer is disposed so as to face a direction substantially perpendicular to the longitudinal direction of the holder body, and wherein said specimen-holding surface is tilted so that a side of said specimen-holding surface nearest to the X-ray analyzer becomes closer to the X-ray analyzer.

15. A specimen holder comprising:

a holder body having a longitudinal direction;

a specimen-holding table supported by said holder body, said specimen-holding table having a specimen-holding surface for placing a specimen thereon; and a first tilting mechanism connecting said specimen-holding table and said holder body, wherein said tilting mechanism tilts said specimen-holding table, about a center axis, with the center axis substantially parallel to the longitudinal direction of said holder body.

16. A specimen holder according to claim 15, further comprising an X-ray analyzer disposed so as to face a direction substantially perpendicular to the longitudinal direction of said holder body.

17. A specimen holder according to claim 15, further comprising a second tilting mechanism for tilting said specimen-holding table, with a direction substantially perpendicular to the longitudinal direction of said holder body defining the center axis of tilting.

18. A specimen holder according to claim 16, further comprising a second tilting mechanism for tilting said specimen-holding table, with a direction substantially perpendicular to the longitudinal direction of said holder body defining the center axis of tilting.

* * * * *

UNITED STATES PATENT AND TRADEMARK OFFICE
CERTIFICATE OF CORRECTION

PATENT NO. : 6,677,595 B1
DATED : January 13, 2004
INVENTOR(S) : Toshiaki Aiba

Page 1 of 1

It is certified that error appears in the above-identified patent and that said Letters Patent is hereby corrected as shown below:

Column 6,
Line 20, "a' a" should read -- as a --.

Column 11,
Line 60, "2" should read -- table 2 --.

Column 13,
Line 64, "titled" should read -- tilted --.

Column 16,
Line 56, "mans" should read -- means --.

Column 17,
Line 3, "titled" should read -- tilted --.

Signed and Sealed this

Tenth Day of August, 2004

JON W. DUDAS
*Acting Director of the United States Patent and Trademark Office*